(12) United States Patent
Hirota et al.

(10) Patent No.: US 7,947,330 B2
(45) Date of Patent: May 24, 2011

(54) PRODUCTION METHOD OF FILM, AND FILM

(75) Inventors: Kusato Hirota, Otsu (JP); Yasushi Tateishi, Kyoto (JP)

(73) Assignee: Toray Industries, Inc., Tokyo (JP)

( * ) Notice: Subject to any disclaimer, the term of this patent is extended or adjusted under 35 U.S.C. 154(b) by 1027 days.

(21) Appl. No.: 11/665,757

(22) PCT Filed: Oct. 13, 2005

(86) PCT No.: PCT/JP2005/018863
§ 371 (c)(1),
(2), (4) Date: May 31, 2007

(87) PCT Pub. No.: WO2006/043464
PCT Pub. Date: Apr. 27, 2006

(65) Prior Publication Data
US 2008/0160296 A1 Jul. 3, 2008

(30) Foreign Application Priority Data
Oct. 19, 2004 (JP) .................. 2004-303931

(51) Int. Cl.
*C23C 14/06* (2006.01)
*C23C 14/22* (2006.01)
*B32B 9/00* (2006.01)

(52) U.S. Cl. .............. 427/255.29; 427/489; 427/576; 427/578; 428/451

(58) Field of Classification Search ......... 427/255.29, 427/489, 576, 578; 428/451
See application file for complete search history.

(56) References Cited

U.S. PATENT DOCUMENTS
5,434,008 A 7/1995 Felts
2005/0287378 A1* 12/2005 Klein et al. ............ 428/458

FOREIGN PATENT DOCUMENTS
EP 0 470 777 A2 2/1992
JP 4-251736 A 9/1992
JP 8-72193 A 3/1996
JP 10095067 A 4/1998

* cited by examiner

*Primary Examiner* — D. S Nakarani
(74) *Attorney, Agent, or Firm* — Birch, Stewart, Kolasch & Birch, LLP

(57) ABSTRACT

A production method of a film of the present invention is a production method of a film, in which after a polymer base is wound off, metal is evaporated, and an oxygen gas is introduced and the inorganic compound layer is formed in an excitation atmosphere of an organic silicon compound containing gas when an inorganic compound layer is formed on the surface of a polymer base. The production method of a film of the present invention can produce a film having a high gas barrier property against an oxygen gas, a water vapor and the like.

8 Claims, 1 Drawing Sheet

US 7,947,330 B2

PRODUCTION METHOD OF FILM, AND FILM

TECHNICAL FIELD

The present invention relates to a production method of a film, and a film. The present invention particularly relates to a film having an inorganic compound layer on a polymer film and a production method thereof, and further to a inorganic compound deposition film having a an inorganic compound layer on a polymer film.

BACKGROUND ART

Conventionally, gas barrier films prepared by forming an inorganic deposition film on the surface of a plastic base are used for applications requiring to block various gases such as a water vapor, an oxygen gas and the like. The gas barrier films are used for packaging various articles such as particularly, foods, drugs and medicines and industrial goods. In the gas barrier film, an inorganic deposition film is formed by vapor-depositing inorganic substances (including inorganic oxides) such as aluminum oxide, silicon oxide, magnesium oxide and the like by utilizing a physical vapor deposition (PVD) method such as a vacuum deposition method, a sputtering method or an ion plating method, a chemical vapor deposition (CVD) method such as a plasma chemical vapor deposition method, a thermal chemical vapor deposition method or a photochemical vapor deposition method, or the like.

In order to improve a gas barrier property of deposition films for packaging, various methods for treating the surface of the deposition film after forming a deposition film are employed. There is, for example, a method in which a metal oxide layer is formed on a film base by a PVD method or a CVD method and an inorganic-organic hybrid polymer layer is laminated on the metal oxide layer. Also, a method of vapor-depositing a mixture of aluminum oxide and silicon oxide on a film base, which is described in Patent Document 1, a method, described in Patent Document 2, in which an organosilicon gas is flown into a chamber between the surface of a film and a source of inorganic substances to be evaporated during the source of inorganic substances to be evaporated generates inorganic evaporated species, a method in which an inorganic oxide is vapor-deposited on a base and then the deposited base is coated with an organic substance and an inorganic oxide is further vapor-deposited thereon, and a method of vapor-depositing silicon oxide on a base are known.

However, in the case where a hybrid polymer was formed on the surface of an inorganic deposition film or a mixture of aluminum oxide and silicon oxide was vapor-deposited on a film base, even if an organosilicon gas was flown into a chamber between the surface of a film and a source of inorganic substances to be evaporated during the source of inorganic substances to be evaporated generates inorganic evaporated species, it was difficult to produce a gas barrier film having a high gas barrier property stably. Also, even if an inorganic oxide is vapor-deposited on a base and then the deposited base is coated with an organic substance and an inorganic oxide is further vapor-deposited thereon or silicon oxide is vapor-deposited on a base, there is a problem that these methods were expensive.

Patent Document 1: Japanese Unexamined Patent Publication No. 10-95067

Patent Document 2: Japanese Unexamined Patent Publication No. 4-251736

DISCLOSURE OF THE INVENTION

The present invention pertains to a production method of a film, in which after a polymer base is wound off, metal is evaporated, and an oxygen gas is introduced and the inorganic compound layer is formed in an excitation atmosphere of an organic silicon compound containing gas when an inorganic compound layer is formed on the surface of a polymer base.

Further, the present invention pertains to a film having an inorganic compound layer on a polymer base, wherein a thickness of the inorganic compound layer is 0.002 to 0.3 μm, and the concentration of an aluminum atom is 15 to 40 atm %, the concentration of a carbon atom is 10 to 30 atm %, the concentration of an oxygen atom is 25 to 70 atm %, and the concentration of a silicon atom is 0.1 to 20 atm % in a film of the inorganic compound layer, and a water vapor permeability of the overall film is 1.0 g/m$^2$·24 h or less.

DESCRIPTION OF THE REFERENCE NUMERALS

Figure 1:
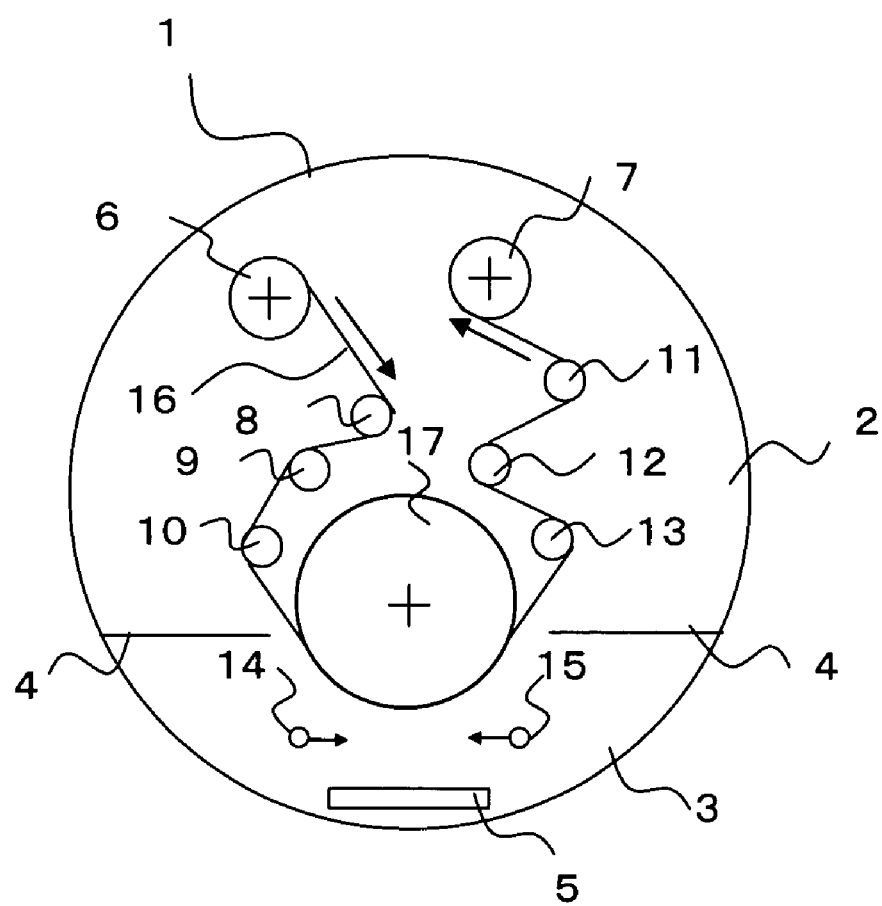
FIG. 1 is a schematic view showing an example of a vacuum web metallizer for embodying the present invention.

1: vacuum web metallizer
2: winding chamber
3: vapor deposition chamber
4: bulkhead
5: boat
6: winding off roll
7: winding roll
8: guide roll on the winding off side
9: guide roll on the winding off side
10: guide roll on the winding off side
11: guide roll on the winding side
12: guide roll on the winding side
13: guide roll on the winding side
14: equipment for introducing oxygen on the winding off side
15: equipment for introducing oxygen on the winding side
16: polymer film (base film)
17: cooling drum

BEST MODE FOR CARRYING OUT THE INVENTION

The present invention pertains to a production method of a film, in which after a polymer base is wound off, metal is evaporated, and an oxygen gas is introduced and the inorganic compound layer is formed in an excitation atmosphere of an organic silicon compound containing gas when an inorganic compound layer is formed on the surface of a polymer base.

Hereinafter, the present invention will be described in more detail.

A polymer base used for the production method of a film of the present invention is not particularly limited as long as it is an organic polymer compound. As the polymer base used in the present invention, films comprising various polymers of, for example, polyolefins such as polyethylene and polypropylene, polyesters such as polyethylene terephthalate and polyethylene naphthalate, polyamides, polycarbonates, polystyrenes, polyvinyl alcohols, saponificate of ethylene-vinyl acetate copolymer, polyacrylonitrile and polyacetals can be used. A polymer base used for the film of the present invention is preferably polyethylene terephthalate. A polymer composing the polymer base used in the present invention may be either a homopolymer or a copolymer, and it may be used singly or as a blend.

In the production method of a film of the present invention, as the polymer base, a single-layer film, a film of two or more-layer formed by a co-extrusion process, a uniaxial oriented film, a biaxially oriented film or the like can be used.

A thickness of the polymer base used in the present invention is not particularly limited, but the thickness is preferably 5 to 100 μm, and more preferably 7 to 60 μm from the viewpoint of the stability in forming an inorganic compound.

A film and the like, to which additives such as an antistatic agent, an ultraviolet absorber, a plasticizer, a lubricant and a filler are, for example, added to the extent of not impairing the effects of the present invention as required, can be used for the polymer base used in the present invention.

In the production method of a film of the present invention, metal is evaporated.

The metal evaporated in the present invention is not particularly limited. The metal evaporated in the present invention is, for example, silicon, magnesium, zinc, aluminum, oxides thereof and mixtures thereof, and is preferably aluminum.

In the production method of a film of the present invention, an inorganic compound layer is formed on the surface of the polymer base.

A method of forming the inorganic compound layer on the polymer base is not particularly limited and, for example, the inorganic compound layer is formed by a vacuum deposition method, a sputtering method, or an ion plating method using metal such as aluminum. Since the films thus formed have defects, the permeation of gas cannot be completely inhibited and the gas barrier property of the film is limited. Therefore, in the present invention, by filling the defects with, for example, organic silicon compound containing gas plasma to introduce an organic silicon compound or a resolvent thereof into aluminum oxide, a high gas barrier property can be achieved.

As the method of forming the inorganic compound layer on the polymer base, a vacuum deposition method, a sputtering method, and an ion plating method are exemplified. As the method of forming the inorganic compound layer on the polymer base, the vacuum deposition method is preferred. As a method of heating a raw material for vapor deposition, for example, an electron beam (EB) method, a high frequency induction heating method, and an ohmic-resistance heating method are employed.

In the production method of a film of the present invention, a thickness of the inorganic compound layer formed on the surface of the polymer base is preferably 0.002 to 0.3 μm, more preferably 0.003 to 0.2 μm, and furthermore preferably 0.005 to 0.01 μm.

In the production method of a film of the present invention, an oxygen gas is introduced and the inorganic compound layer is formed on the surface of the polymer base in an excitation atmosphere of an organic silicon containing gas.

In the production method of a film of the present invention, the excitation atmosphere refers to an atmosphere in which atoms or molecules being ionized or in a radical state exist. As a technique of forming the excitation atmosphere, for example, plasma, an electron beam, or an ion beam is used. As a technique of forming the excitation atmosphere, plasma is preferably used. Since a higher input power for plasma accelerates the decomposition of an organic silicon containing compound more, the gas permeability which is an object of the present invention can be kept low. An amount of the power is preferably 200 W or more, and more preferably 500 W or more.

In the production method of a film of the present invention, an amount of oxygen to be introduced may have an effect on the transparency and the gas permeability of the film. When the amount of oxygen to be introduced is too small, the transparency may be deteriorated. When this amount is too large, the transparency is achieved but the gas permeability may become large. A proper range of the amount of an oxygen is preferably 0.4 L/min or more and less than 0.8 L/min, and more preferably 0.45 L/min or more and less than 0.7 L/min.

In the production method of a gas barrier film of the present invention, an organic silicon compound refers to a compound containing silicon in a molecule. Examples of the organic silicon compound include silane, methylsilane, dimethylsilane, trimethylsilane, tetramethylsilane, ethylsilane, diethylsilane, triethylsilane, tetraethylsilane, propoxysilane, dipropoxysilane, tripropoxysilane, tetrapropoxysilane, dimethylsiloxane, tetramethoxysilane, tetraethoxysilane, tetrapropoxysilane, tetramethyldisiloxane, hexamethyldisiloxane, tetramethoxysilane, tetraethoxysilane, tetrapropoxysilane, hexamethylcyclotrisiloxane, octamethylcyclotetrasiloxane, decamethylcyclopentasiloxane, undecamethylcyclohexasiloxane, dimethyldisilazane, trimethyldisilazane, tetramethyldisilazane, hexamethyldisilazane, hexamethylcyclotrisilazane, octamethylcyclotetrasilazane, decamethylcyclopentasilazane, and undecamethylcyclohexasilazane. As the organic silicon containing compound, methoxysilane, decamethylcyclopentasiloxane, hexamethyldisiloxane, and tetraethoxysilane are preferably used from the viewpoint of safety and handling. Also, the organic silicon compound may be decomposed in advance by a publicly known method to be introduced.

In the production method of a film of the present invention, post-treatment may be applied after forming the inorganic compound layer. As a method of the post-treatment, a method of performing heat treatment (for example, at 60° C. for about two days) which is useful for reducing an unreacted group, corona treatment, or plasma treatment using an oxygen gas or water vapor is preferred. These post-treatments may be carried out in a vapor deposition machine.

In the production method of a film of the present invention, a volume ratio of an organic silicon compound gas to an oxygen gas, charged at the time of forming the inorganic compound layer, is preferably 0.1 to 10%. When the volume ratio is less than 0.1%, a desired silicon concentration cannot be attained and therefore there may be cases where the permeation of gas cannot be inhibited. When the volume ratio is more than 10%, since the degree of vacuum is deteriorated during forming the inorganic compound layer, a mean free path of gas decreases and an inorganic compound layer containing impurities is formed, and therefore there may be cases where the permeation of gas cannot be inhibited.

Next, an example of the method of producing a film of the present invention will be specifically described.

Using a vacuum web metallizer, a polymer film is used as a base, and the polymer base is wound off from a winding chamber of the vacuum metallizer and introduced into a cooling drum through a guide roll on the winding off side.

An aluminum wire is introduced in a boat, and aluminum is evaporated by an ohmic-resistance heating method, and oxygen and organic silicon compound containing gas plasma are introduced into a system to form a deposition film of an inorganic compound on one side of a polymer film introduced. In this time, an organic silicon compound containing gas may be introduced into oxygen gas plasma. Also, when the oxygen and the organic silicon compound containing gas are introduced into an aluminum vapor, these gases may be mixed in advance, and the mixture gas may be brought into a plasma state and then introduced into the aluminum vapor.

In the production method of a film of the present invention, a method of vapor-depositing aluminum in gas plasma containing oxygen and organic silicon-containing siloxane is preferred. Also, an aluminum vapor may be brought into a plasma state. Further, the aluminum vapor may be formed by evaporating aluminum itself. An oxygen gas and aluminum vapor may be formed by heating aluminum oxide.

Thereafter, the polymer base is wound around a winding roll through a guide roll on the winding side.

After the polymer base is wound off, metal is evaporated, and when an inorganic compound layer is formed on the surface of the polymer base, the inorganic compound layer is formed in an organic silicon containing gas plasma atmosphere.

The film produced by the method of the present invention can also be freely combined with and laminated on materials for packaging composing containers for packaging, for example, other resin films, paper base materials, metal materials, synthetic paper, cellophane and the like, to produce various laminates. These laminates can be employed as, for example, materials for packaging suitable for packaging various articles.

As other resin films to be formed into a laminate, either an unstretched film, or a monoaxially or biaxially oriented film can be used. Also, a thickness of other resin films can be selected from a range of several microns to several hundreds microns to be used.

The film produced by the method of the present invention may be any one of a film formed by extrusion, a film formed by tubular film process, and a film formed by coating.

As for other resin films for forming a laminate, a resin material to be used is not particularly limited, and as a specific material, a material appropriately selected from, for example, low density polyethylene, intermediate density polyethylene, high density polyethylene, linear low density polyethylene, polypropylene, ethylene-propylene copolymer, ethylene-vinyl acetate copolymer, ionomer resin, ethylene-ethyl acrylate copolymer, ethylene-acrylic acid or ethylene-methacrylic acid copolymer, acid modified polyolefin-based resin, methylpentene polymer, polybutene-based resin, polyvinyl chloride-based resin, polyvinyl acetate-based resin, polyvinylidene chloride-based resin, vinyl chloride-vinylidene chloride copolymer, poly(meth)acrylic-based resin, polyacrylonitrile-based resin, polystyrene-based resin, acrylonitrile-styrene copolymer (AS resin), acrylonitrile-butadiene-styrene-copolymer (ABS resin), polyester-based resin, polyamide-based resin, polycarbonate-based resin, polyvinyl alcohol-based resin, saponificate of ethylene-vinyl acetate copolymer, fluororesin, diene-based resin, polyacetal-based resin, polyurethane-based resin and nitrocellulose can be used.

Further, as paper base materials to be formed into a laminate, a material having a basis weight of 80 to 600 g/m$^2$ is preferably used, and a material having a basis weight of 10 to 450 g/m$^2$ is more preferably used. Specifically, for example, strongly sizing bleached or unbleached paper base materials, or paper base materials such as white machine glazed paper, kraft paper, board and converted paper can be used.

Further, as for the above-mentioned metal materials, for example, resin films with aluminum foil or aluminum deposition film can be used.

A method of preparing a laminate using the film obtained by the production method of the present invention is not particularly limited and a laminate is preferably produced by, for example, the following method.

After a pre-treatment such as a corona treatment, an ozone treatment, or a flame treatment is applied onto the surface of the film obtained by the production method of the present invention as required, a laminate is produced by a method of laminating publicly known materials for packaging using polyester-based, isocyanate-based (urethane-based), polyethyleneimine-based, polybutadiene-based, or organic titanium-based anchor coating agent, or polyurethane-based, polyacrylic, polyester-based, epoxy-based, polyvinyl acetate-based, cellulose-based or other adhesive for laminating. Here, a method of lamination is not particularly limited, and for example, a wet lamination method, a dry lamination method, a solvent-free dry lamination method, an extrusion lamination method, a T die extrusion method, a coextrusion lamination method, a tubular film process, a coextrusion tubular film process, and the like can be employed.

Next, a method of performing bag forming or case forming using laminates will be described.

When a softly packaging bag composed of a polymer film, or the like is formed as a container for packaging, a bag body can be constructed by using a laminate produced by the above-mentioned method, and folding the laminate with the faces of a heat seal resin layer of an inner layer of the laminate opposed to each other, or overlaying two sheets of the laminate with the faces of heat seal resin layers of inner layers of the laminates opposed to each other, and heat sealing the peripheral portion of the laminate to form a sealed portion. Also, as for a bag forming method, a wide variety of containers for packaging can be fabricated by folding the laminate with the faces of an inner layer of the laminate opposed to each other, or overlaying two sheets of the laminate with the faces of inner layers of the laminates opposed to each other, and heat sealing the peripheral edge of the laminate by heat seal forms such as side seal type, two-sided seal type, three-sided seal type, four-sided seal type, an envelope seal type, a pillow seal type, pleated seal, flat bottom seal type, and rectangular bottom seal type. In addition, for example, a standing pouch packaging bag can also be fabricated and a tubular container or the like can also be fabricated by use of the above laminate.

Heat sealing can be performed by publicly known methods, for example, bar seal, rotating roller seal, belt seal, impulse seal, high frequency seal, and ultrasonic seal. Further, to the above-mentioned container for packaging, one-piece type, two-piece type or other type spout, or zippers for open/close may be appropriately attached.

Further, when paper containers for filling liquid containing paper base materials are produced as containers for packaging, it is possible with laminates, for example, that a laminate is produced by laminating a paper base material on a gas barrier film obtained by the production method of the present invention, and after a blank plate for fabricating desired paper containers is produced from this laminate, a barrel portion, a bottom portion and a head portion are formed using this blank plate to fabricate paper containers for liquid of brick type, flat type or Goebel top type, for example. Also, with respect to the shapes of containers, it is possible to fabricate any shape such as a rectangular container or a circular cylindrical paper can.

The container using the film obtained by the production method of the present invention has an excellent gas barrier property against an oxygen gas or the like and excellent impact resistance and further has high suitability for post-processing such as laminating, printing, bag forming and case forming. The container using the film obtained by the production method of the present invention prevents the peeling of the inorganic compound as a barrier film, inhibits the formation of thermal cracks thereof, and prevents the degradation thereof to exert excellent resistance as a barrier film. The container using the film obtained by the production method of the present invention has excellent suitability for packaging and storing various articles, for example, foods, drugs and medicines, chemicals or cosmetics such as detergents, shampoos, oils, toothpaste, adhesives and sticker, and others.

Next, the film of the present invention will be described.

The film of the present invention is a film having an inorganic compound layer on a polymer base, wherein a thickness of the inorganic compound layer is 0.002 to 0.3 μm, and the concentration of an aluminum atom is 15 to 40 atm %, the concentration of a carbon atom is 10 to 30 atm %, the concentration of an oxygen atom is 25 to 70 atm %, and the concentration of a silicon atom is 0.1 to 20 atm % in a film of the inorganic compound layer, and a water vapor permeability of the overall film is 1.0 g/m²·24 h or less.

The film of the present invention is a film having an inorganic compound layer on a polymer base, wherein a thickness of the inorganic compound layer is 0.002 to 0.3 μm.

The film of the present invention has a water vapor permeability of the overall film of 1.0 g/m²·24 h or less.

The film of the present invention is a film having an inorganic compound layer on a polymer base, wherein the concentration of an aluminum atom is 15 to 40 atm %, the concentration of a carbon atom is 10 to 30 atm %, the concentration of an oxygen atom is 25 to 70 atm %, and the concentration of a silicon atom is 0.1 to 20 atm % in the inorganic compound layer, measured by a scanning transmission electron microscope.

In the present invention, values of the concentrations of atoms can be measured according to the methods described in "Denshi-Kenbikyo Riyo No Kiso (Basis for Using Electron Microscope)" (KYORITSU SHUPPAN CO., LTD.), p. 113-118", and "Igaku. Seibutsugaku Denshi-Kenbikyo Kansatsu Hou (Medicine. Biology Electron Microscope Observation Method)" (MARUZEN CO., LTD.), p. 300-319".

The concentrations of aluminum, carbon, oxygen and silicon atoms of the present invention refer to the concentrations of aluminum, carbon, oxygen and silicon atoms, the total of which is assumed to be 100 atm %, in the case where an oxygen concentration in the formed inorganic compound becomes the maximum.

In the present invention, a specimen was sliced off from the whole layer including the polymer base by a thin-section method using a microtome and the specimen was analyzed by a scanning transmission electron microscope.

The concentration of an aluminum atom needs to be 40 atm % or lower from the viewpoint of introducing an organic silicon compound or a resolvent thereof into defects in aluminum oxide to inhibit the permeation of gas, and the concentration of an aluminum atom is preferably 15 to 38 atm %.

When the concentration of an aluminum atom measured by a scanning transmission electron microscope is lower than 15 atm %, number of defects in aluminum oxide increases and an organic silicon containing compound cannot fill the defects, and therefore the permeation of gas cannot be inhibited and a high gas barrier property cannot be achieved.

The concentration of a carbon atom measured by a scanning transmission electron microscope quantitatively represents an amount of carbon within the film. When the concentration of a carbon atom is 10 to 30 atm %, carbon atoms are introduced into aluminum oxide and the defects of aluminum oxide are filled with the carbon atoms and the film becomes closely packed, and therefore gas such as oxygen becomes hard to permeate. The concentration of a carbon atom is preferably 10 to 12 atm %. When the concentration of a carbon atom is more than 30 atm %, number of defects in aluminum oxide increases and an organic silicon containing compound cannot fill the defects, and therefore the permeation of gas cannot be inhibited and a high gas barrier property cannot be achieved.

The concentration of a silicon atom quantitatively represents an amount of silicon within the film, and when the concentration of a silicon atom is 0.1 to 20 atm %, silicon atoms are introduced into the film and the film becomes closely packed, and therefore gas such as oxygen becomes hard to permeate and a high gas barrier property can be achieved as a whole. The concentration of a silicon atom is preferably 0.1 to 11 atm %. When the concentration of a silicon atom is more than 20 atm %, number of defects in aluminum oxide increases and an organic silicon compound cannot fill the defects, and therefore the permeation of gas cannot be inhibited and a high gas barrier property cannot be achieved.

In the film of the present invention, the concentration of an oxygen atom in the inorganic compound layer is 25 to 70 atm %. The concentration of an oxygen atom is preferably 50 to 60 atm %. When the concentration of an oxygen atom is higher than 70 atm %, number of defects in aluminum oxide increases and an organic silicon compound cannot fill the defects, and therefore the permeation of gas cannot be inhibited and a high gas barrier property cannot be achieved.

The film of the present invention may contain another atoms as long as it is provided with characteristics such as a gas, barrier property which is an object of the present invention and transparency.

In the gas barrier film of the present invention, a ratio of the concentration of an oxygen atom to the concentration of an aluminum atom, measured by an X-ray photo electron spectroscopy method, is generally 1.5 to 2.5, and more preferably 2 to 2.5 from the viewpoint of improving a gas barrier property.

Further, the concentration of an atom in the inorganic compound layer of the film of the present invention can be measured by a secondary ion mass spectroscopy method.

The concentrations of silicon, carbon and hydrogen atoms based on the secondary ion mass spectroscopy method are measured by analyzing the whole layer including the polymer base by the secondary ion mass spectroscopy method according to a method described in "Hyomen Bunseki (Surface Analysis): SIMS-Niji-Ion Shisuryo Bunsekihou No Kiso To Ouyo (Basis and Application of Secondary Ion Mass Spectroscopy Method) (printed by Agune Shoufu Sha), p. 181-200".

The concentrations of silicon, carbon and hydrogen atoms based on the secondary ion mass spectroscopy method quantitatively represent the amounts of silicon, carbon and hydrogen within the film, respectively, and when the concentrations of silicon and carbon are higher, silicon atoms and carbon atoms are introduced into aluminum oxide and fill the defects of aluminum oxide and the film becomes closely packed, and therefore gas such as oxygen becomes hard to permeate. Since hydrogen is positioned at a terminal of a bond, if the value of the hydrogen concentration decreases, the number of terminals becomes less, and therefore the defects are filled more and the film becomes more closely packed, and gas becomes hard to permeate.

Herein, the concentration of a silicon atom refers to the concentration of an atom of silicon in the case where a silicon concentration in the formed inorganic compound becomes the maximum, and the concentrations of carbon and hydrogen atoms refer to the concentrations of carbon and hydrogen atoms in the case where a carbon concentration and a hydrogen concentration in the formed inorganic compound become the minimum.

The ratio of the concentration of an oxygen atom to the concentration of an aluminum atom can be determined by employing an X-ray photoelectron spectroscopy (ESCA) method exemplified in Journal of Polymer Science, Vol. 26, 559-572 (1988) and Journal of the Adhesion Society of Japan, Vol. 27, No. 4 (1991). That is, the above-mentioned ratio can be determined by performing wide scanning and narrow scanning, measuring the concentration of an aluminum atom and the concentration of an oxygen atom, and calculating a ratio between the concentrations.

In the film of the present invention, generally, the concentration of a silicon atom with a mass number of 28 is $9 \times 10^{19}$ to $1 \times 10^{21}$ atoms/cc, the concentration of a silicon atom with a mass number of 29 is $5 \times 10^{20}$ to $1.5 \times 10^{22}$ atoms/cc, the concentration of a carbon atom is $3.5 \times 10^{20}$ to $1 \times 10^{22}$ atoms/cc, and the concentration of a hydrogen atom is $5.5 \times 10^{21}$ to $5 \times 10^{22}$ atoms/cc when measured by the secondary ion mass spectroscopy method.

The film of the present invention has a water vapor permeability of 1.0 g/m$^2 \cdot$24 h or less from the viewpoint of being used as materials for packaging or a part of a packaging body. The water vapor permeability is preferably 0.8 g/m$^2 \cdot$24 h or less, and furthermore preferably 0.5 g/m$^2 \cdot$24 h or less. Also, an oxygen permeability is preferably 1.5 cc/m$^2 \cdot$atm$\cdot$24 h or less. The oxygen permeability is more preferably 0.8 cc/m$^2 \cdot$atm$\cdot$24 h or less.

The film produced by the production method of a film of the present invention is a film having a high gas barrier property against an oxygen gas, water vapor and the like, and a film useful for packaging various articles, for example, foods, drugs and medicines and industrial goods. The production method of a film of the present invention can produce a film having a high gas barrier property at low cost.

EXAMPLES

Next, the present invention will be described specifically by way of examples. Further, the characteristics of the produced film were measured by the following methods.

1. Method of measuring the concentrations of aluminum, carbon, oxygen and silicon in the inorganic compound layer on the polymer base by a scanning transmission electron microscope These concentrations were measured according to a method described in Hyomen Bunseki Gijyutsu Sensho (Surface Analysis Technical Selection) "Transmission Electron Microscope (edited by The Surface Science Society of Japan, Maruzen Co., Ltd.)".

A specimen was sliced off from the whole layer including the polymer base by a thin-section method using a microtome and the specimen was analyzed by a scanning transmission electron microscope. After a film thickness was measured with a transmission electron microscope, quantities of generated characteristic X-rays of aluminum, carbon, oxygen and silicon within the film were measured and these quantities were converted to the concentrations of the respective elements. The values of the concentrations of atoms of the respective layers were measured according to the methods described in "Denshi-Kenbikyo Riyo No Kiso (Basis for Using Electron Microscope) (KYORITSU SHUPPAN CO., LTD.), p. 113-118", and "Igaku•Seibutsugaku Denshi-Kenbikyo Kansatsu Hou (Medicine∩Biology Electron Microscope Observation Method) "(MARUZEN CO., LTD.), p. 300-319". Measuring conditions are as follows.

Apparatus: scanning transmission electron microscope (HRSTEM) (HB 501 manufactured by VG LTD.), EDX: KEVEX DELTAplus quantitative total system (energy dispersive X-ray spectrometer (si <Li> semiconductor detector, UTW type)

Measuring condition: accelerate voltage; 100 kV, absorbed electron current in specimen; $10^{-9}$ A, measuring time; 100 seconds 2. Method of measuring the oxygen permeability The permeability was measured in the conditions of a temperature of 23° C. and a relative humidity of 0% using an oxygen permeability measuring apparatus manufactured by US MOCON, Inc. (model OXTRAN 2/20).

3. Method of measuring the water vapor permeability

The permeability was measured in the conditions of a temperature of 40° C. and a relative humidity of 90% using a water vapor permeability measuring apparatus manufactured by US MOCON, Inc. (model PERMATRAN W 3/31).

4. Method of measuring the concentrations of silicon, carbon and hydrogen in the inorganic compound layer on the polymer base based on the secondary ion mass spectroscopy method These concentrations were measured according to a method described in "Hyomen Bunseki (Surface Analysis): SIMS-Niji-Ion Shisuryo Bunsekihou No Kiso To Ouyo (Basis and Application of Secondary Ion Mass Spectroscopy Method) (printed by Agune Shoufu Sha), p. 181-200".

A primary electron is irradiated to the whole layer including the polymer base and a mass of a secondary electron emitted was analyzed by a secondary ion mass spectrograph. In order to conduct a quantitative analysis, a calibration curve was drawn by a sample in which the carbon concentration within a film is previously known by ion implantation and thereby an amount of carbon within a film was measured quantitatively. Measuring conditions are as follows.

Measuring apparatus: ADEPT 1010 manufactured by ULVAC-PHI, INCORPORATED

Measuring Conditions:

Primary ion: Cs$^+$ ion

Primary ion accelerate energy: 1 kV

Secondary ion polarity: negative (detection of a negative ion)

Raster area: 400 μm×800 μm

Analysis area (area ratio): 9%

Charge compensation: E-gun (electron gun)

Example 1

Using a vacuum web metallizer having an equipment structure shown in FIG. 1, a biaxial oriented polyethylene terephthalate film of 12 μm in thickness (Lumirror 12 T705 produced by Toray Industries Inc.) is used as a base, and a film, on one side of which an inorganic compound layer is provided by using aluminum as a source of substance to be evaporated to evaporate aluminum by an ohmic-resistance heating method and introducing organic silicon compound containing gas plasma, was prepared.

FIG. 1 is a view of equipment constitution schematically showing an example of a vacuum web metallizer for performing the production method for forming the inorganic compound layer.

First, a polymer base 16 is set up on a winding off roll 6 in a winding chamber 2 of the vacuum web metallizer 1 and wound off, and sent to a cooling drum 16 through guide rolls 8, 9 and 10. Since aluminum is evaporated from a wire of aluminum etc. introduced onto a boat 5 and a plasma gas of an organic silicon containing compound is introduced from equipment 14 for introducing plasma gas on the winding off side and equipment 15 for introducing plasma gas on the winding side, an inorganic compound is formed on the surface of the polymer base 16 at a position on this cooling drum 17. Thereafter, the polymer base 16 provided with the inorganic compound is wound around a winding roll 7 through guide rolls 13, 12 and 11.

In this time, oxygen was introduced in an amount of 0.65 L/min, and decamethylcyclopentasiloxane was used as an organic silicon compound and introduced in such a way that a volume ratio of decamethylcyclopentasiloxane to an oxygen gas is 3%, and an input power for plasma was set at 1200 W.

The concentrations of aluminum, oxygen, silicon and carbon atoms in the inorganic compound, the oxygen permeability and the water vapor permeability of the obtained film were measured. Measurement results of the concentrations of aluminum, oxygen, silicon and carbon atoms in the inorganic compound layer, measured by a scanning transmission electron microscope, are shown in Table 1. The concentrations of silicon, carbon and hydrogen atoms in the inorganic compound layer, based on the secondary ion mass spectroscopy method, are shown in Table 2.

Example 2

An inorganic compound film was prepared by following the same procedure as in Example 1 except for introducing oxygen in an amount of 0.55 L/min, introducing methoxysilane as an organic silicon containing compound in such a way that a volume ratio of methoxysilane to an oxygen gas is 9%, and setting an input power for plasma at 400 W.

The concentrations of aluminum, oxygen, silicon and carbon atoms in the inorganic compound and the oxygen permeability and the water vapor permeability of the obtained film were measured.

Example 3

An inorganic compound film was prepared by following the same procedure as in Example 1 except for introducing oxygen in an amount of 0.45 L/min, introducing hexamethyldisiloxane as an organic silicon containing compound in such a way that a volume ratio of hexamethyldisiloxane to an oxygen gas is 0.2%, and setting an input power for plasma at 1200 W.

Example 4

An inorganic compound film was prepared by following the same procedure as in Example 1 except for introducing oxygen in an amount of 0.6 L/min, introducing tetraethoxysilane as an organic silicon containing compound in such a way that a volume ratio of tetraethoxysilane to an oxygen gas is 1.3%, and setting an input power for plasma at 900 W.

Comparative Example 1

An aluminum oxide deposition film was prepared by following the same procedure as in Example 1 except for introducing only oxygen in an amount of 0.65 L/min as an introduced gas and not charging plasma.

Comparative Example 2

An inorganic compound film was prepared by following the same procedure as in Example 3 except for not charging plasma.

The concentrations of aluminum, oxygen, silicon and carbon atoms in the inorganic substance layer, measured by a scanning transmission electron microscope, and the oxygen permeability and the water vapor permeability of the films obtained in the Examples and Comparative Examples are shown in Table 1, and the concentrations of silicon, carbon and hydrogen atoms in the inorganic substance layer, based on the secondary ion mass spectroscopy method, of the films obtained in the Examples and Comparative Examples are shown in Table 2.

TABLE 1

| Sample | Concentration of an aluminum atom [atm %] | Concentration of a carbon atom [atm %] | Concentration of an oxygen atom [atm %] | Concentration of a silicon atom [atm %] | Oxygen permeability [cc/m$^2$ · atm · 24 h] | Water vapor permeability [g/m$^2$ · 24 h] |
|---|---|---|---|---|---|---|
| Example 1 | 18.2 | 15.2 | 66.3 | 0.3 | 1.2 | 0.4 |
| Example 2 | 38.7 | 17.8 | 25.3 | 18.2 | 1.0 | 0.4 |
| Example 3 | 15.2 | 28.8 | 55.8 | 0.2 | 0.9 | 0.6 |
| Example 4 | 22.3 | 11.9 | 55.7 | 10.1 | 0.7 | 0.5 |
| Comparative Example 1 | 36.3 | 0 | 63.7 | 0 | 2.0 | 1.8 |
| Comparative Example 2 | 12.2 | 32.8 | 54.8 | 0.2 | 1.9 | 1.2 |

TABLE 2

| Sample | Concentration of an oxygen atom/ Concentration of an aluminum atom | Concentration of a silicon atom (mass number: 28) [atoms/cc] | Concentration of a silicon atom (mass number: 29) [atoms/cc] | Concentration of a carbon atom [atoms/cc] | Concentration of a hydrogen atom [atoms/cc] |
|---|---|---|---|---|---|
| Example 1 | 2.2 | $1.4 \times 10^{20}$ | $1.5 \times 10^{21}$ | $1.6 \times 10^{21}$ | $8.3 \times 10^{21}$ |
| Example 2 | 2.0 | $9.0 \times 10^{20}$ | $1.3 \times 10^{22}$ | $8.0 \times 10^{21}$ | $3.0 \times 10^{22}$ |
| Example 3 | 1.7 | $9.2 \times 10^{19}$ | $5.1 \times 10^{20}$ | $3.7 \times 10^{20}$ | $5.6 \times 10^{21}$ |
| Example 4 | 2.3 | $5.4 \times 10^{20}$ | $8.7 \times 10^{21}$ | $6.1 \times 10^{21}$ | $1.9 \times 10^{22}$ |
| Comparative Example 1 | 2.3 | $8.7 \times 10^{19}$ | $4.5 \times 10^{20}$ | $3.3 \times 10^{20}$ | $5.3 \times 10^{21}$ |
| Comparative Example 2 | 2.6 | $8.5 \times 10^{19}$ | $3.5 \times 10^{20}$ | $3.0 \times 10^{20}$ | $5.2 \times 10^{21}$ |

INDUSTRIAL APPLICABILITY

The production method of a film of the present invention can produce a film having a high gas barrier property against an oxygen gas, a water vapor and the like.

The film of the present invention is useful for packaging various articles, for example, foods, drugs and medicines and industrial goods.

The invention claimed is:

1. A production method of a film, which comprises exposing a polymer base to metal vapor, oxygen gas, and an organic silicon compound containing gas in an excitation atmosphere to form an inorganic compound layer on the surface of the polymer base, wherein a volume ratio of the organic silicon compound gas to the oxygen gas, charged at the time of forming the inorganic compound layer, is 0.1 to 10%.

2. The production method of a film according to claim 1, wherein the excitation atmosphere is a plasma atmosphere.

3. The production method of a film according to claim 2, wherein the metal is aluminum.

4. The production method of a film according to claim 3, wherein the organic silicon compound is decamethylcyclopentasiloxane, hexamethyldisiloxane, methoxysilane, tetraethoxysilane, or decamethylcyclopentasiloxane.

5. The production method of a film according to claim 4, wherein the oxygen gas is introduced in a range of 0.4 L/min or more and less than 0.8 L/min.

6. The production method of a film according to claim 1, wherein the metal is aluminum.

7. The production method of a film according to claim 1, wherein the organic silicon compound is decamethylcyclopentasiloxane, hexamethyldisiloxane, methoxysilane, tetraethoxysilane, or decamethylcyclopentasiloxane.

8. The production method of a film according to claim 1, wherein the oxygen gas is introduced in a range of 0.4 L/min or more and less than 0.8 L/min.

* * * * *